(12) United States Patent
Daubenspeck et al.

(10) Patent No.: US 8,426,247 B2
(45) Date of Patent: Apr. 23, 2013

(54) POLYMER AND SOLDER PILLARS FOR CONNECTING CHIP AND CARRIER

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/463,855

(22) Filed: May 4, 2012

(65) Prior Publication Data
US 2012/0220117 A1  Aug. 30, 2012

Related U.S. Application Data

(62) Division of application No. 12/028,848, filed on Feb. 11, 2008, now abandoned.

(51) Int. Cl.
*H01L 21/44* (2006.01)

(52) U.S. Cl.
USPC ........... 438/108; 438/118; 257/E23.023; 257/E23.068

(58) Field of Classification Search .......... 438/108, 438/118
See application file for complete search history.

(56) References Cited

U.S. PATENT DOCUMENTS

| | | | |
|---|---|---|---|
| 4,878,611 A * | 11/1989 | LoVasco et al. ......... 228/180.22 | |
| 5,633,535 A | 5/1997 | Chao et al. | |
| 6,461,890 B1 | 10/2002 | Shibata | |
| 7,092,603 B2 | 8/2006 | Glebov et al. | |
| 2005/0207693 A1 | 9/2005 | Yokouchi | |
| 2006/0104566 A1 | 5/2006 | Bakir et al. | |
| 2006/0118604 A1 | 6/2006 | Buchwalter et al. | |
| 2006/0211171 A1 | 9/2006 | Tummala et al. | |
| 2008/0036059 A1 * | 2/2008 | Pohl et al. ...................... 257/686 |
| 2009/0026607 A1 * | 1/2009 | Huebner et al. ............... 257/737 |

OTHER PUBLICATIONS

U.S. Appl. No. 12/028,848, filed Feb. 11, 2008, Office Action Communication, Aug. 24, 2009, 7 pages.
U.S. Appl. No. 12/028,848, filed Feb. 11, 2008, Office Action Communication, Jan. 14, 2010, 9 pages.
U.S. Appl. No. 12/028,848, filed Feb. 11, 2008, Office Action Communication, Jun. 1, 2010, 10 pages.

(Continued)

*Primary Examiner* — Wael Fahmy
*Assistant Examiner* — Sarah Salerno
(74) *Attorney, Agent, or Firm* — Gibb & Riley, LLC; Richard M. Kotulak, Esq.

(57) ABSTRACT

A method of connecting chips to chip carriers, ceramic packages, etc. (package substrates) forms smaller than usual first solder balls and polymer pillars on the surface of a semiconductor chip and applies adhesive to the distal ends of the polymer pillars. The method also forms second solder balls, which are similar in size to the first solder balls, on the corresponding surface of the package substrate to which the chip will be attached. Then, the method positions the surface of the semiconductor chip next to the corresponding surface of the package substrate. The adhesive bonds the distal ends of the polymer pillars to the corresponding surface of the package substrate. The method heats the first solder balls and the second solder balls to join the first solder balls and the second solder balls into solder pillars.

19 Claims, 3 Drawing Sheets

OTHER PUBLICATIONS

U.S. Appl. No. 12/028,848, filed Feb. 11, 2008, Advisory Action Communication, Jul. 16, 2010, 4 pages.
U.S. Appl. No. 12/028,848, filed Feb. 11, 2008, Office Action Communication, Feb. 28, 2011, 13 pages.
U.S. Appl. No. 12/028,848, filed Feb. 11, 2008, Office Action Communication, Jun. 22, 2011, 14 pages.
U.S. Appl. No. 12/028,848, filed Feb. 11, 2008, Advisory Action Communication, Sep. 1, 2011, 4 pages.
U.S. Appl. No. 12/028,848, filed Feb. 11, 2008, Office Action Communication, Oct. 12, 2011, 10 pages.
U.S. Appl. No. 12/028,848, filed Feb. 11, 2008, Office Action Communication, Jan. 27, 2012, 9 pages.
U.S. Appl. No. 12/028,848, filed Feb. 11, 2008, Advisory Action Communication, Mar. 26, 2012, 5 pages.
Rajoo, et al., "Super Stretched Solder Interconnects for Wafer Level Packaging," IEEE, Electronic Components and Technology Conference 2006, pp. 1227-1232.
Bakir, et al., "Electrical and Optical Chip I/O Interconnections for Gigascale Systems," IEEE Transactions on Electron Devices, vol. 54, No. 9, Sep. 2007, pp. 2426-2437.

* cited by examiner

POLYMER AND SOLDER PILLARS FOR CONNECTING CHIP AND CARRIER

CROSS-REFERENCE TO RELATED APPLICATIONS

This application is a divisional of U.S. patent application Ser. No. 12/028,848, filed Feb. 11, 2008, abandoned on Aug. 28, 2012, the complete disclosure of which is incorporated herein by reference.

BACKGROUND

1. Field of the Invention

The embodiments of the invention generally relate to methods of connecting chips to chip carriers, ceramic packages, etc. (package substrates) and to a method that forms smaller than usual first solder balls and polymer pillars on the surface of a semiconductor chip and forms second solder balls on the corresponding surface of the package substrate to which the chip will be attached. The method heats the first solder balls and the second solder balls to join the first solder balls and the second solder balls into solder pillars.

2. Description of the Related Art

In conventional systems, solder balls are used to join chips to the package. However, it is becoming increasingly difficult to ensure solder ball reliability due to the following trends: smaller solder ball size (for higher I/O density); larger chip size; plastic packaging (with larger coefficient of thermal expansion (CTE) than ceramic packages); and the use of Pb-free solder (with higher reflow temperature and higher modulus than Pb-containing solder). The coefficient of thermal expansion mismatch between the chip and the package can result in high stress in the solder joints, which can cause cracks and eventually device failure.

SUMMARY

In view of the foregoing, an embodiment of the invention provides a method of connecting chips to chip carriers, ceramic packages, etc. (package substrates) that forms smaller than usual first solder balls and polymer pillars on the surface of a semiconductor chip. The method applies adhesive to the distal ends of the polymer pillars.

The polymer pillars extend further from the surface of the semiconductor chip than the first solder balls to an extent such that the applying of the adhesive to the distal ends of the polymer pillars is performed without applying adhesive to the first solder balls.

The method also forms second solder balls, which are similar in size to the first solder balls, on the corresponding surface of the package substrate to which the chip will be attached. Then, the method positions the surface of the semiconductor chip next to the corresponding surface of the package substrate such that the distal ends of the polymer pillars contact the corresponding surface of the package substrate and such that the first solder balls contact corresponding ones of the second solder balls.

The combined diameters of the first solder balls and the second solder balls is equal to or greater than a dimension that the polymer pillars extend from the surface of the semiconductor chip. Thus, when the polymer pillars contact the surface of the substrate, the first solder balls are pushed against the second solder balls and the solder balls make very good contact with each other. The method heats the first solder balls and the second solder balls to join the first solder balls and the second solder balls into solder pillars. The heating process heats the first and second solder balls to a temperature at least equal to a melting point of the first solder balls and the second solder balls (the heating process reflows the solder). After the solder cools below its melting point, the resulting solder structure forms as solder pillars.

The adhesive bonds the distal ends of the polymer pillars to the corresponding surface of the package substrate. Thus, because they are firmly attached between the chip and the substrate, the polymer pillars maintain relative positions of the surface of the integrated circuit chip and the corresponding surface of the package substrate during the heating of the first solder balls and the second solder balls.

The first and second solder balls (which can be lead-free solder) are approximately the same size on the substrate and on the chip, but are only approximately one-half the exterior size (approximately one quarter of the volume) of a standard C4 (controlled collapsible chip connection) solder balls. The C4 solder balls are conventionally only formed on the chip when forming connections to the substrate.

After the heating process (reflow), the two smaller solder balls would be expected to have somewhere between ½ and ¼ the volume of solder contained in the single conventional C4 bump (because each smaller solder ball has only approximately one quarter of the volume of a standard C4 solder ball). Thus, during reflow, the two smaller solder balls would be expected to collapse as occurs conventionally with the C4 solder balls. However, the height of the polymer pillars controls the stand-off distance between the chip surface and the corresponding substrate surface, which prevents the solder from collapsing into a spherical shape. Because of the presence of the polymer pillars, the solder balls join to form a solder pillar, whose shape is determined by a combination of the solder volume, the sizes of the back level metalization (BLM) and substrate pads, and the polymer pillar height. Further, the solder pillars provide greater physical support between the semiconductor chip and the package substrate relative to their originally formed solder. By observing the resulting structure, it sometimes can be seen that the solder pillars actually comprise two joined solder balls.

The foregoing process produces a unique structure that comprises polymer pillars and solder pillars positioned between and connecting the semiconductor chip and the package substrate. The solder pillars have a shape and a size similar to that of the polymer pillars. However, the polymer pillars comprise optical transmission media (adapted to transmit optical signals between the semiconductor chip and the package substrate) while the solder pillars comprise electrical transmission media (adapted to transmit electrical signals between the semiconductor chip and the package substrate).

As described above, these solder and polymer pillars are elongated structures, as contrasted with the conventional rounded C4 solder balls (used conventionally to connect the chip and the substrate). Thus, the height (first dimension) of the solder pillars and the polymer pillars between the semiconductor chip and the package substrate is at least 2 times their width (second dimension that is perpendicular to the first dimension).

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
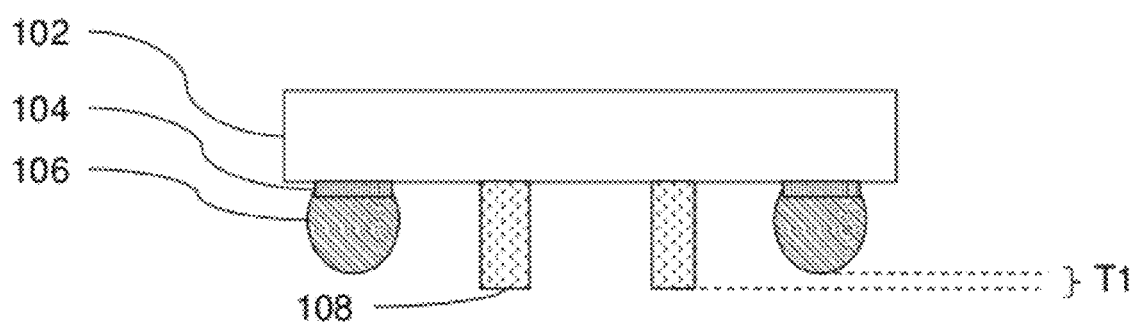
FIG. 1 illustrates a schematic diagram of an integrated circuit assembly.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

One solution to relieving stress in solder connections is to use elongated solder connections. For example, elongated solder connections can be formed by joining the chip to the package at the solder reflow temperature, mechanically separating the chip from the package to elongate the solder, and then cooling the solder in the "stretched state". This process provides an elongated solder connection for improved reliability; however, this process is difficult to implement in manufacturing.

Hence, an effective process for making elongated solder connections would be useful. It would also be advantageous to form electrical and optical I/Os on the same chip, which would be useful for connections between, for example, stacked chips or connections from the chip to the package. For example, U.S. Patent Publication 2006/0104566 to Bakir et al. (the complete disclosure of which is incorporated herein by reference) uses polymer pillars for the optical inputs/outputs and solder balls for the electrical inputs/outputs.

However, when polymer pillars are used in combination with rounded solder ball connections, the polymer pillars should be taller than the solder balls (to allow dipping into an adhesive). For example, as shown in FIG. 1, a semiconductor chip 102 includes contact pads 104 upon which solder balls 106 are formed. These solder balls form electrical input/output connections. In addition, the structure includes polymer pillars 108 that form optical input/output connections. For a detailed description of how such structures are formed, and the materials and processing for creating such structures, reference is made to the previously mentioned U.S. Patent Publication 2006/0104566, and such explanation is not repeated herein.

Figure 2:
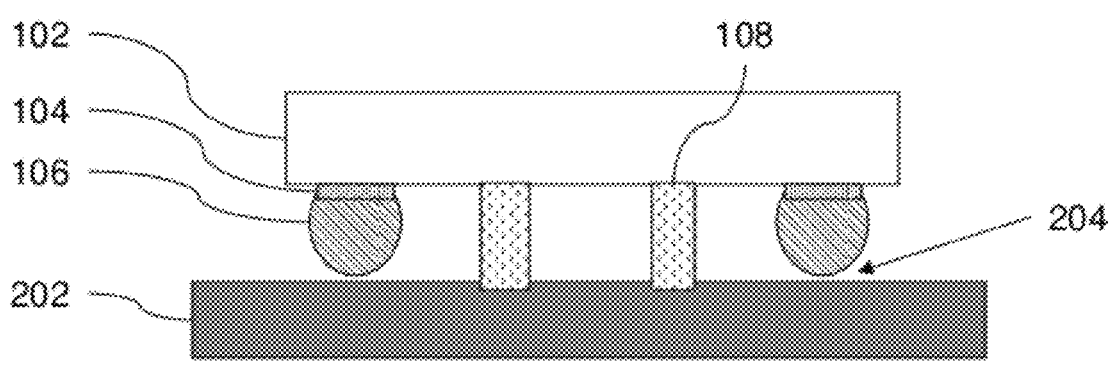
FIG. 2 illustrates a schematic diagram of an integrated circuit assembly.
Figure 3:
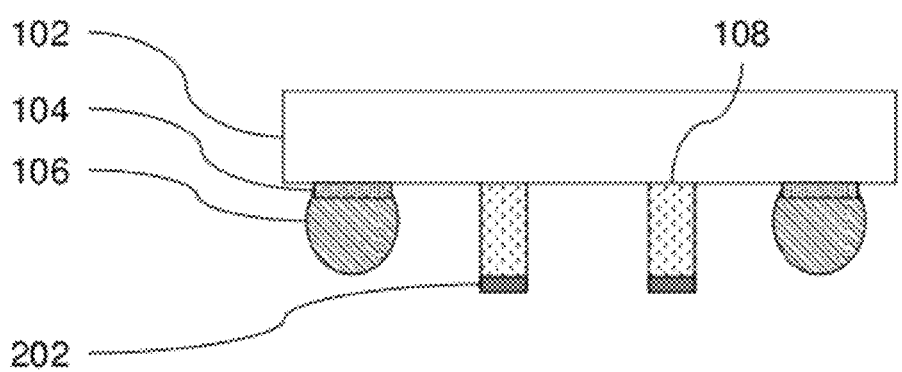
FIG. 3 illustrates a schematic diagram of an integrated circuit assembly.
Figure 4:
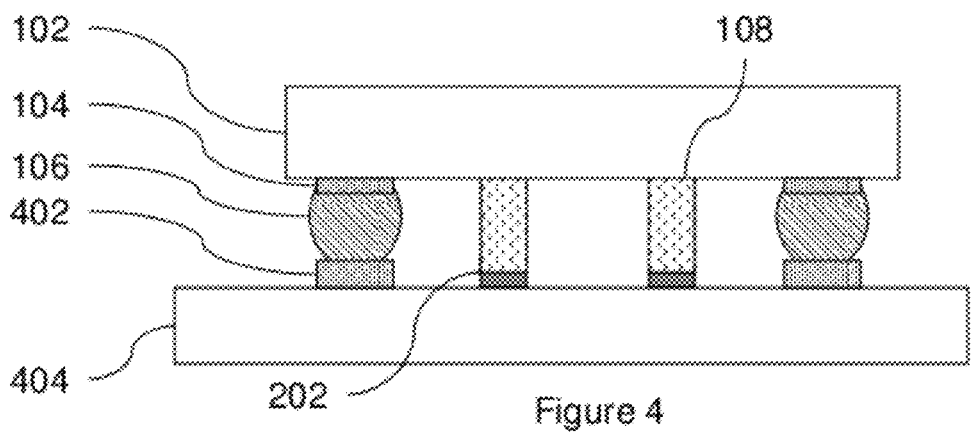
FIG. 4 illustrates a schematic diagram of an integrated circuit assembly.

As shown in FIG. 1, the polymer pillars 108 are taller than the solder balls 106 by a measure labeled T1 in FIG. 1. In FIG. 2, the distal ends of the polymer pillars 108 are dipped into an adhesive 202, which results in the distal ends of the polymer pillars 108 being covered with adhesive 202 as shown in FIG. 3. Then, as shown in FIG. 4, the chip 102 can be positioned adjacent to a package substrate 404 such that the solder balls 106 make contact with pads 402 on the package substrate 404 and such that the polymer pillars 180 become attached to the package substrate 404 by means of the adhesive 202.

The height difference between the solder balls 106 and the polymer pillars 108, discussed above, (T1) allows the polymer pillars 108 to be dipped into an adhesive 202, as shown in FIG. 2, without having the adhesive 202 contact the solder balls 106. Therefore, it is desirable to maintain a gap (shown as item 204 in FIG. 2) between the solder balls 106 and the adhesive 202, to prevent the solder balls 106 from becoming contaminated with the adhesive 202.

If the height difference T1 is too small, the solder balls may be contaminated by the adhesive 202 and may not form good connections with the pads 402. If the height difference T1 is too great, the solder balls may not be large enough to make contact with the bond pad 402. It is difficult to ensure that the solder balls 106 make contact to the bond pads 402 on the substrate because, if the solder balls 106 are too small, they may not reach the bond pads 402. To the contrary, if the solder balls 106 are too large, no gap 204 may be present and the solder balls may be covered with adhesive 202. This adhesive 202 can interfere with the ability of the solder balls 106 to bond with the pads 402.

In view of these issues, the processing sequence shown in FIGS. 5-9 is utilized to form a new structure and ensure that the electrical connections between the chip 102 and the package substrate 404 are formed properly. More specifically, as shown in FIGS. 5-9, a method is disclosed that creates a new structure and which properly forms electrical connections when both electrical and optical connections are utilized between semiconductor chips and packaging substrates.

Figure 5:
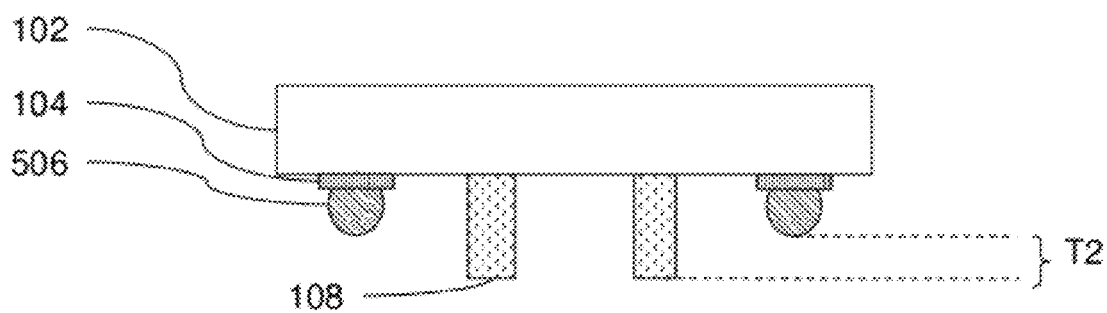
FIG. 5 illustrates a schematic diagram of an integrated circuit assembly.
Figure 10:
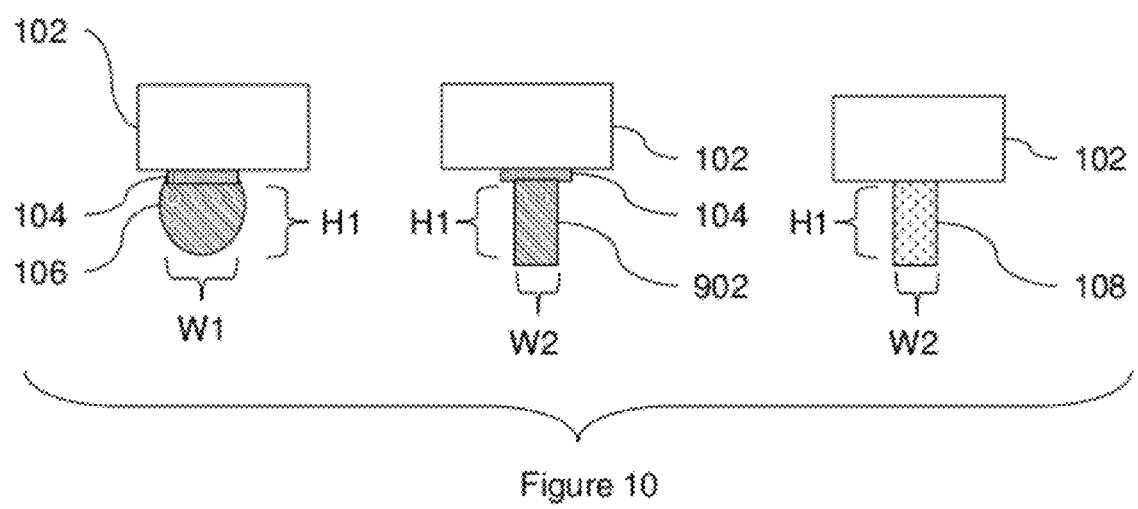
FIG. 10 illustrates a schematic diagram of an integrated circuit assembly.

More specifically, FIG. 5 illustrates a similar structure to that shown in FIG. 1; however, in FIG. 5, rather than using the full-size solder balls 106, the structure in FIG. 5 utilizes smaller solder balls 506. This increases the height difference to a measure shown as T2 which is greater than the height difference T1 shown in FIG. 1. For example, the smaller solder balls 506 could be approximately one-half to three-quarters of the height (H1, which is shown in FIG. 10 and discussed below) of the polymer pillars 108, which would allow T2 to be approximately one-quarter to one-half the height of the polymer pillar (H1).

Figure 6:
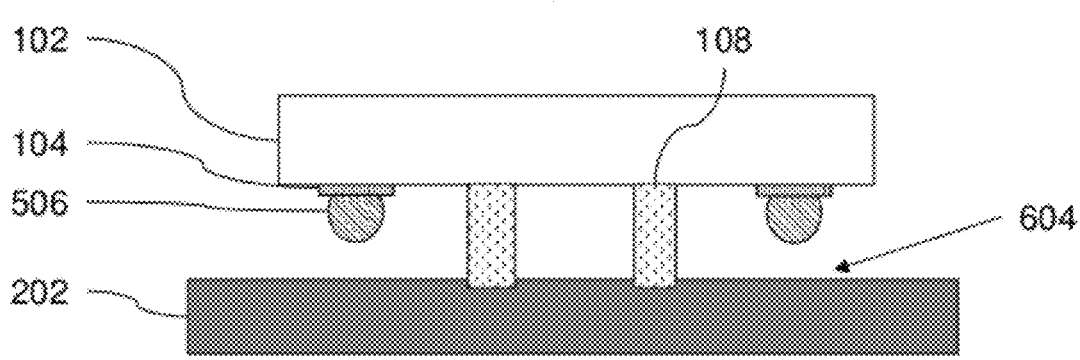
FIG. 6 illustrates a schematic diagram of an integrated circuit assembly.
Figure 7:
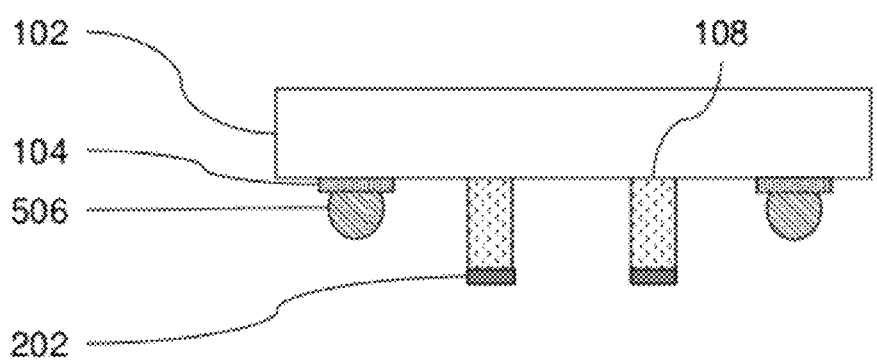
FIG. 7 illustrates a schematic diagram of an integrated circuit assembly.
Figure 8:
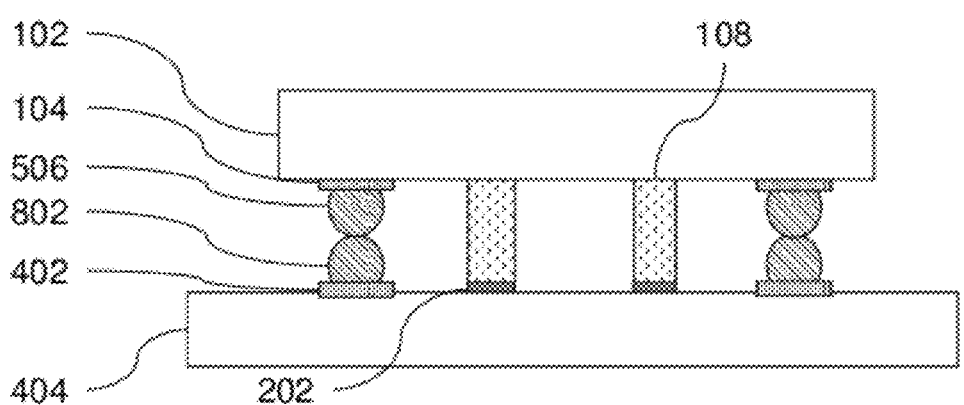
FIG. 8 illustrates a schematic diagram of an integrated circuit assembly.

Thus, in FIG. 6, the method applies adhesive 202 to the distal ends of the polymer pillars 108 (the distal ends are the ends of the polymer pillars 108 that are furthest away the surface of the semiconductor chip 102 opposite the ends that are connected to the semiconductor chip 102). This allows in the tips of the polymer pillars 108 be coated in adhesive 202 as shown in FIG. 7.

The polymer pillars 108 extend further from the surface of the semiconductor chip 102 than the first solder balls 506 to an extent such that the applying of the adhesive to the distal ends of the polymer pillars 108 is performed without applying adhesive to the first solder balls 506. In other words, the greater height difference T2 produces a larger gap 604 (when compared to gap 204 shown in FIG. 2) and provides a much greater margin for error than did the smaller height difference T1. The larger gap 604 substantially reduces the chance of the smaller solder balls 506 becoming contaminated with the adhesive 202, which increases yield and decreases waste.

In order to ensure that a good electrical connection is formed, the method also forms second solder balls 802, which are similar in size to the first solder balls 506, on the bond pads 402 of the corresponding surface of the package substrate 404 to which the chip 102 will be attached. Then, the method positions the surface of the semiconductor chip 102 next to the corresponding surface of the package substrate 404 such that the distal ends of the polymer pillars 108 contact the corresponding surface of the package substrate 404 and such that the first solder balls 506 contact corresponding ones of the second solder balls 802.

The combined diameters of the first solder balls 506 and the second solder balls 802 is equal to or greater than a dimension that the polymer pillars 108 extend from the surface of the semiconductor chip 102. Thus, when the polymer pillars 108 contact the surface of the substrate 404, the first solder balls 506 are pushed against the second solder balls 802 and the solder balls make very good contact with each other.

Figure 9:
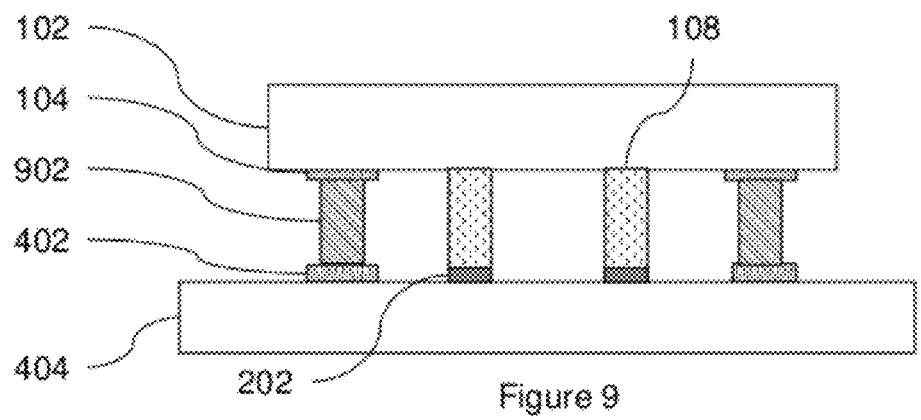
FIG. 9 illustrates a schematic diagram of an integrated circuit assembly.

The method heats the first solder balls 506 and the second solder balls 802 to join the first solder balls 506 and the second solder balls 802 into solder pillars 902, as shown in FIG. 9. The heating process heats the first and second solder balls 802 to a temperature at least equal to a melting point of the first solder balls 506 and the second solder balls 802 (the heating process reflows the solder). After the solder cools below its melting point, the resulting solder structure forms as solder pillars 902.

The adhesive 202 bonds the distal ends of the polymer pillars 108 to the corresponding surface of the package substrate 404. Thus, because they are firmly attached between the chip 102 and the substrate 404 by the adhesive 202, the polymer pillars 108 maintain the relative positions of the surface of the integrated circuit chip 102 and the corresponding surface of the package substrate 404 during the heating of the first solder balls 506 and the second solder balls 802. This prevents the first and second solder balls 506, 802 from collapsing into a larger ball shape and, instead, forces the solder balls 506, 802 to take an elongated pillar-like shape upon cooling.

The first and second solder balls 802 (which can be lead-free solder) are approximately the same size on the substrate 404 and on the chip 102, but are only approximately one-half the exterior size (approximately one quarter of the volume) of the C4 solder balls that would be required if the processing shown in FIGS. 1-4 were being performed. As shown above, in FIGS. 1-4, the C4 solder balls are conventionally only formed on the chip 102 when forming connections to the substrate 404.

After the heating process (reflow), the two smaller solder balls would be expected to have somewhere between ½ and ¼ the volume of solder contained in the single C4 bump used in FIG. 1-4 (because each smaller solder ball has only approximately one quarter of the volume of a standard C4 solder ball shown in FIG. 1-4). Thus, during reflow, the two smaller solder balls would be expected to collapse as occurs conventionally with the C4 solder balls.

However, the height of the polymer pillars 108 controls the stand-off distance between the chip 102 surface and the corresponding substrate 404 surface, which prevents the solder balls 506, 802 from collapsing into a spherical shape. Because of the presence of the polymer pillars 108, the solder balls 506, 802 join to form the solder pillar 902, whose shape is determined by a combination of the solder volume, the sizes of the substrate 404 pads, and the polymer pillar 108 height.

As described above, the solder and polymer pillars 108, 902 are elongated structures, as contrasted with the conventional rounded C4 solder balls 106 (used conventionally to connect the chip 102 and the substrate 404). Because they are elongated, the height (first dimension H1) of the solder pillars 902 and the polymer pillars 108 between the semiconductor chip 102 and the package substrate 404 is approximately at least 2 times their width (second dimension W2 that is perpendicular to the first dimension) as shown in FIG. 10. To the contrary, the height (first dimension H1) of the solder balls 106 between the semiconductor chip 102 and the package substrate 404 is about the same as their width (second dimension W1 that is perpendicular to the first dimension) as also shown in FIG. 10. The measures H1, W1, and W2 shown in FIG. 10 are only approximate relative measures and the pillars are not all exactly the same size, but are all similarly elongated. Thus, the solder pillars 902 are elongated, as contrasted with the rounded solder balls 106 shown in FIGS. 1-4.

Figure 11:
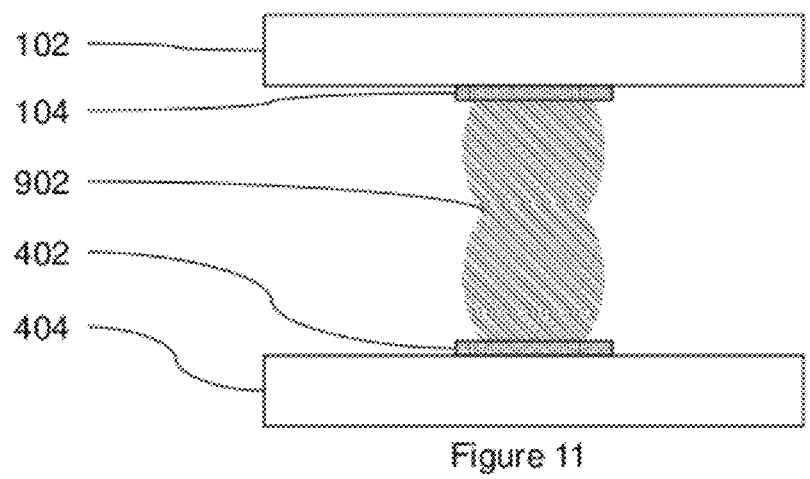
FIG. 11 illustrates a schematic diagram of an integrated circuit assembly.

Further, the solder pillars 902 provide greater physical support between the semiconductor chip 102 and the package substrate 404 relative to their originally formed solder 506. The solder pillars 902 can have a somewhat uneven elongated shape. For example, by observing some embodiments of the resulting structure, it sometimes can be seen that the solder pillars 902 actually comprise two joined solder balls, as shown in FIG. 11.

The foregoing process produces a unique structure that comprises polymer pillars 108 and solder pillars 902 positioned between and connecting the semiconductor chip 102 and the package substrate 404. The solder pillars 902 have a shape and a size similar to that of the polymer pillars 108. However, the polymer pillars 108 comprise optical transmission media (adapted to transmit optical signals between the semiconductor chip 102 and the package substrate 404) while the solder pillars 902 comprise electrical transmission media (adapted to transmit electrical signals between the semiconductor chip 102 and the package substrate 404).

With the foregoing method shown in FIGS. 5-9, the larger gap 604 substantially reduces the chance of the smaller solder balls 506 becoming contaminated with the adhesive 202, which increases yield and decreases waste; yet, when the polymer pillars 108 contact the surface of the substrate 404, the first solder balls 506 are pushed against the second solder balls 802 and the solder balls make very good contact with each other, which increases yield and reliability. Therefore, the process and structure discussed above produces a new structure and increases yield and reliability.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method comprising:
   forming first solder balls on a surface of a semiconductor chip;
   forming polymer pillars on said surface of said semiconductor chip;
   forming second solder balls on a surface of a package substrate;
   positioning said surface of said semiconductor chip to oppose said surface of said package substrate, said positioning of said semiconductor chip including each of said polymer pillars contacting said surface of said package substrate and each of said first solder balls contacting a corresponding one of said second solder balls; and
   heating said first solder balls and said second solder balls to join said first solder balls and said second solder balls into solder pillars.

2. The method according to claim 1, said polymer pillars extending further from said surface of said semiconductor chip than said first solder balls.

3. The method according to claim 1, combined heights of each of said first solder balls and each said corresponding one of said second solder balls being approximately equal to a height of each of said polymer pillars.

4. The method according to claim 1, said polymer pillars maintaining relative positions of said surfaces of said semiconductor chip and of said package substrate during said heating of said first solder balls and said second solder balls.

5. The method according to claim 1, said heating comprising heating to a temperature at least equal to a melting point of said first solder balls and said second solder balls.

6. A method comprising:
   forming first solder balls on a surface of a semiconductor chip;
   forming polymer pillars on said surface of said semiconductor chip;
   applying adhesive to distal ends of said polymer pillars, said distal ends comprising ends of said polymer pillars that are furthest away from said surface of said semiconductor chip;
   forming second solder balls on a surface of a package substrate;
   positioning said surface of said semiconductor chip to oppose said surface of said package substrate, said positioning of said semiconductor chip including distal ends of each of said polymer pillars contacting said surface of said package substrate and each of said first solder balls contacting a corresponding one of said second solder balls, and said adhesive bonding said distal ends of said polymer pillars to said surface of said package substrate; and
   heating said first solder balls and said second solder balls to join said first solder balls and said second solder balls into solder pillars.

7. The method according to claim 6, said polymer pillars extending further from said surface of said semiconductor chip than said first solder balls and said applying of said adhesive to said distal ends of said polymer pillars being performed without applying adhesive to said first solder balls.

8. The method according to claim 6, combined heights of each of said first solder balls and each said corresponding one of said second solder balls being approximately equal to a height of each of said polymer pillars.

9. The method according to claim 6, said polymer pillars maintaining relative positions of said surfaces of said semiconductor chip and of said package substrate during said heating of said first solder balls and said second solder balls.

10. The method according to claim 6, said heating comprising heating to a temperature at least equal to a melting point of said first solder balls and said second solder balls.

11. A method comprising:
    forming first solder balls on a surface of a semiconductor chip;
    forming polymer pillars on said surface of said semiconductor chip;
    applying adhesive to distal ends of said polymer pillars, said distal ends comprising ends of said polymer pillars that are furthest away from said surface of said semiconductor chip;
    forming second solder balls on a surface of a package substrate;
    positioning said surface of said semiconductor chip to oppose said surface of said package substrate, said positioning of said semiconductor chip including distal ends of each of said polymer pillars contacting said surface of said package substrate and each of said first solder balls contacting a corresponding one of said second solder balls, and said adhesive bonding said distal ends of said polymer pillars to said surface of said package substrate; and
    heating said first solder balls and said second solder balls to join said first solder balls and said second solder balls into solder pillars, said solder pillars being elongated, positioned between and connecting said semiconductor chip and said package substrate, and said solder pillars having a height, H, and a width, W, that is approximately ½ H.

12. The method according to claim 11, said polymer pillars extending further from said surface of said semiconductor chip than said first solder balls and said applying of said adhesive to said distal ends of said polymer pillars being performed without applying adhesive to said first solder balls.

13. The method according to claim 11, said polymer pillars maintaining relative positions of said surfaces of said semiconductor chip and of said package substrate during said heating of said first solder balls and said second solder balls.

14. The method according to claim 11, said heating comprising heating to a temperature at least equal to a melting point of said first solder balls and said second solder balls.

15. The method according to claim 1, any of said first solder balls, said second solder balls, and a combination of said first solder balls and said second solder balls comprising a lead-free solder.

16. The method of claim 1, said polymer pillars forming optical input/output (I/O) connections between said semiconductor chip and said package substrate, and said solder pillars forming electrical input/output (I/O) connections between said semiconductor chip and said package substrate.

17. The method of claim 1, a height of said first solder balls being approximately one-half to three-quarters of a height of said polymer pillars.

18. The method of claim 1, each of said solder pillars having a height, H, and a width, W, that is approximately ½ H.

19. The method of claim 1, said contacting of said surface of said package substrate by each of said polymer pillars being accomplished by an adhesive applied to a distal end of each of said polymer pillars, before said heating of said first solder balls and said second solder balls to form said solder pillars.

* * * * *